United States Patent [19]

Takiguchi

[11] Patent Number: 5,691,579
[45] Date of Patent: Nov. 25, 1997

[54] CURRENT SWITCHING CIRCUIT OPERABLE AT HIGH SPEED WITHOUT EXTERNALLY SUPPLIED REFERENCE BIAS

[75] Inventor: Tomio Takiguchi, Tokyo, Japan

[73] Assignee: NEC Corporation, Tokyo, Japan

[21] Appl. No.: 582,442

[22] Filed: Jan. 3, 1996

[51] Int. Cl.⁶ .................................................. H01H 19/64

[52] U.S. Cl. .......................... 307/113; 327/427; 327/436; 323/265; 323/273; 323/282; 307/139; 307/113; 307/125

[58] Field of Search .................................. 327/427, 436; 323/265, 273, 282; 307/113, 125, 139; 341/136, 144

[56] References Cited

U.S. PATENT DOCUMENTS

| | | |
|---|---|---|
| 4,831,282 | 5/1989 | Colles . |
| 5,517,150 | 5/1996 | Okumura ................................. 327/427 |

*Primary Examiner*—William M. Shoop, Jr.
*Assistant Examiner*—Kiu Lockett
*Attorney, Agent, or Firm*—Whitham, Curtis, Whitham & McGinn

[57] ABSTRACT

A constant current source is connected to a first node that connects on the one hand to a predetermined potential via a first switching transistor with a control electrode thereof connected to a signal input terminal, a second node, and a resistive conduction member, and on the other hand to a current output terminal via a second switching transistor with a control electrode thereof connected to the second node to constitute a current switching circuit operable without an external reference bias and with a reduced number of components.

6 Claims, 11 Drawing Sheets

FIG. 3 PRIOR ART

| INPUT DATA | | | DECODER OUTPUT | | | | | | | ANALOG OUTPUT |
|---|---|---|---|---|---|---|---|---|---|---|
| Din3 | Din2 | Din1 | D(A) | D(B) | D(C) | D(D) | D(E) | D(F) | D(G) | Vout |
| 0 | 0 | 0 | 0 | 0 | 0 | 0 | 0 | 0 | 0 | GND |
| 0 | 0 | 1 | 1 | 0 | 0 | 0 | 0 | 0 | 0 | $I \cdot R_L$ |
| 0 | 1 | 0 | 1 | 1 | 0 | 0 | 0 | 0 | 0 | $2I \cdot R_L$ |
| 0 | 1 | 1 | 1 | 1 | 1 | 0 | 0 | 0 | 0 | $3I \cdot R_L$ |
| 1 | 0 | 0 | 1 | 1 | 1 | 1 | 0 | 0 | 0 | $4I \cdot R_L$ |
| 1 | 0 | 1 | 1 | 1 | 1 | 1 | 1 | 0 | 0 | $5I \cdot R_L$ |
| 1 | 1 | 0 | 1 | 1 | 1 | 1 | 1 | 1 | 0 | $6I \cdot R_L$ |
| 1 | 1 | 1 | 1 | 1 | 1 | 1 | 1 | 1 | 1 | $7I \cdot R_L$ |

CURRENT SWITCHING CIRCUIT OPERABLE AT HIGH SPEED WITHOUT EXTERNALLY SUPPLIED REFERENCE BIAS

BACKGROUND OF THE INVENTION

The present invention generally relates to a current switching circuit, and particularly, to a current switching circuit operable for a switching at a high speed, without an externally supplied reference bias and hence with a reduced number of component parts, permitting an advantageous application to a digital-to-analog (hereafter "DA") converter as well as to a voltage level converter.

DESCRIPTION OF THE RELATED ART

There has already been known in the art a current switching circuit composed of a number of metal-oxide semiconductor (hereafter "MOS") field effect transistors (hereafter each respectively simply "transistor") of a P-channel type (hereafter sometimes "MP") or of an N-channel type (hereafter sometimes "MN"), such as e.g. by the U.S. Pat. No. 4,831,282 (hereafter "Ref. USP").

FIG. 1 is a circuit diagram of a conventional current switching circuit disclosed in the Ref. USP.

In FIG. 1, designated at reference character 110 is the conventional current switching circuit, which comprises three MOS transistors formed on a p-type semiconductor substrate.

More specifically, as shown in FIG. 1, the switching circuit 110 includes a first p-channel MOS transistor MP10, a second p-channel MOS transistor MP20 and a third p-channel MOS transistor MP30.

The first MOS transistor MP10 is connected at a source electrode 10a thereof to a power supply terminal 106 for the circuit 110, where terminal 106 has a power supply voltage Vdd, and at a gate electrode 10b thereof to a bias voltage input terminal 107 receiving an externally supplied bias voltage $V_B$.

With the bias voltage $V_B$ applied to the gate electrode 10b, the first transistor MP10 conducts therethrough a constant current with a predetermined level I, i.e., it serves as a current source for generating the constant current I, to output the same from a drain electrode 10c thereof connected to a common interconnection node 105.

The second and third transistors MP20 and MP30 are connected at their source electrodes 20a and 30a to the common node 105 and hence therethrough to the drain electrode 10c of the first transistor MP10.

The second transistor MP20 has a gate electrode 20b connected to a reference voltage input terminal 108 receiving an externally supplied constant voltage Vc as a reference bias, and a drain electrode 20c connected to an analog current output terminal 102 of the circuit 110.

The third transistor MP30 has a gate electrode 30b connected to a digital switching signal input terminal 103 of the circuit 110, and a drain electrode 30c connected to a ground terminal 101 for the circuit 110, where terminal 101 has a ground potential GND.

The input terminal 103 receives a digital signal D of which a level change action serves for switching a conduction route of the constant current I, as it is generated to be output from the drain electrode 10c of the first transistor MP10, between a left route (in FIG. 1) extending from the common node 105 via the second transistor MP20 to the current output terminal 102 and a right route (in FIG. 1) extending from the common node 105 via the third transistor MP30 to the ground terminal 101, as will be detailed below.

The digital signal D changes between a high level "1" equivalent to the power supply voltage Vdd and a low level "0" equivalent to the ground potential GND.

When the digital signal D has the high level "1", the third transistor MP30 receiving the signal D, as it is input from the terminal 103 to the gate electrode 30b, is turned off to be non-conductive, while the second transistor MP20 is turned on to conduct therethrough the current I, as will be seen later.

Therefore, the current I output from the drain electrode 10c of the first transistor MP10 is conducted along the left conduction route 105-MP20-102, to be output as an analog current IO from the output terminal 101.

In contrast, when the digital signal D has the low level "0", the third transistor MP30 is turned on to conduct therethrough the current I, while the second transistor MP20 is turned off to be non-conductive.

Therefore, the current I from the first transistor MP10 is conducted along the right conduction route 105-MP30-101, to be grounded.

As described above, the current switching circuit 110 is employable as a principal component of a DA converter.

FIG. 2 is a block diagram of a conventional DA converter disclosed in the Ref. USP. Like members and signals are designated by like reference characters.

In FIG. 2, designated at reference character 140 is the conventional DA converter, which is provided as a 3-bit DA converter and comprises a 3-input/7-output decoder 9 and a total of seven current switching circuits 110 identified by seven ID characters (A) to (G) for this description. Respective signals $V_B$, Vc, D and I0 associated with a respective one of the seven circuits 110(A) to 110(G) are identified by a corresponding one of the ID characters (A) to (G).

The decoder 9 has a total of three digital signal input terminals 13a, 13b and 13c for receiving three bit-representative digital signals Din1, Din2 and Din3 of a digital code input thereto, respectively, where the digital code is most significant bit (hereafter "MSB") being represented by the signal Din3, and its least significant bit (hereafter "LSB") represented by the signal Din1.

The decoder outputs a total of seven bit-representative digital signals D(A) to D(G), of which a respective one is input to a corresponding one of the current switching circuits 110(A) to 110(G). i.e., to a digital signal input terminal 103 (FIG. 1) of the corresponding circuit 110.

As a matter of course, the seven current switching circuits 110(A) to 110(G) each have a bias voltage input terminal 107 (FIG. 1) connected to a common bias voltage input terminal 107' (FIG. 2) of the DA converter 140. The common terminal 107' is applied with a common bias voltage $V_B$, which is supplied therefrom as bias voltages $V_B$(A) to $V_B$(G) to the respective bias voltage input terminals 107 of the circuits 110(A) to 110(G).

Moreover, the current switching circuits 10(A) to 10(G) each have a reference voltage input terminal 108 (FIG. 1) connected to a common reference voltage terminal 108' (FIG. 2) of the DA converter 140. The common terminal 108' is applied with a common reference voltage Vc, which is supplied therefrom as constant bias voltages Vc(A) to Vc(G) to the respective reference voltage input terminals 108 of the circuits 110(A) to 110(G).

Further, the switching circuits 110(A) to 110(G) each have an analog current output terminal 102 (FIG. 1) connected to a common output terminal 102' (FIG. 2) of the DA converter 140, where terminal 102' is connected to a ground terminal 101' via a load resistor 111 with a resistance $R_L$.

Furthermore, the seven circuits 110(A) to 110(G) each include first, second and third MOS transistors MP10, MP20 and MP30 (FIG. 1), in which the first transistor MP10 serves as a current source for generating a constant current of a level I, where current I is switched to be conducted to a ground terminal 101, when a corresponding one of the digital signals D(A) to D(G) is a "0", or to be output from the current output terminal 102, when the corresponding digital signal is a "1".

Letting k be an arbitrary integer such that 0≦k≦7, a total of k switching circuits 110 each output the current I in accordance with a combination of bit values that are represented by the seven digital signals D(A) to D(G), which are output from the decoder 9 in response to a combination of bit values represented by the three digital signals Din1 to Din3 of the digital code input to the DA converter.

A total of k such currents are collected to be conducted via the load resistor 111 to the ground terminal 101', having an analog voltage Vout developed across the resistor 111, such that Vout=kI·$R_L$.

Therefore, the common output terminal 102' of the DA converter 140 has the analog voltage Vout, which is stepwise variable between a ground potential GND and a maxium voltage of 7I×$R_L$ in unit of I×$R_L$ in response to the digital code input to the decoder 9.

According to the above-described arrangement, the DA converter 140 serves for a 3-bit DA conversion.

In this respect, the decoder 9 is controlled to operate in accordance with a truth table shown in FIG. 3.

Incidentally, the current switching circuit 110 of FIG. 1 is a differential type. However, it can work simply with a single input D, without needing a reverse-phase signal to be generated. Therefore, the circuit 110 is composed of a smaller number of components than an old circuit in which a number of extra components had been necessitated for a digital circuit section.

In such a current switching circuit as 110, if the second and third MOS transistors MP20 and MP30 are designed alike in size, then the node 105, as a common interconnection to their sources 20a and 30a, has a potential V(5) variable by a fraction thereof due to an input voltage Vc to the reference voltage input terminal 108, depending on which of the second and third transistor MP20 and MP30 turns on.

The potential variation will be discussed with reference to FIGS. 1 and 4.

FIG. 4 shows respective waveforms of the digital signal D input to the digital signal input terminal 103 and the reference bias voltage Vc applied to the reference voltage input terminal 108 and of a potential V(105) developed at the interconnection node 105 common to the source electrodes 20a and 30a of the second and third transistors MP20 and MP30 in the current switching circuit 110 of FIG. 1.

In FIG. 4, designated as reference character 150 is the waveform of the digital signal D at the input terminal 103; 151 is that of the potential V(105) at the common node 105: and 152 is that of the reference voltage Vc at the input terminal 108.

When the waveform 150 of the signal D at the terminal 103 has the low level "0". i.e., the ground potential GND, the third transistor MP30 is turned on and the second transistor MP20 is turned off, so that the waveform 151 of the potential V(105) at the common node 105 has a level V(105; D="0"), corresponding to a voltage difference $V_{gsMP3}$ between the source electrode 30a and the gate electrode 30b of the third transistor MP30, as the current I is conducted via the transistor MP30.

On the other hand, when the waveform 150 of the signal D at the terminal 103 has the high level "1", i.e., the power supply voltage Vdd, the third transistor MP30 is turned off and the second transistor MP20 is turned on. As the two transistors MP20 and MP30 are assumed to be identical in size, the second transistor MP20 then has between the source and gate electrodes 20a and 20b thereof a voltage difference $V_{gsMP2}$ identical to the above-mentioned voltage difference $V_{gsMP3}$ at the third transistor MP30.

Thus, letting V(105;D="1") be the potential V(105) in the case of the digital signal D having the high level "1", and using the reference voltage Vc at the input terminal 108, it so follows that:

$$V(105;D="1")=Vc+V_{gsMP2} \qquad (1).$$

As the gate-source voltage $V_{gsMP2}$ of the second transistor MP20 is identical to the gate-source voltage $V_{gsMP3}$ of the third transistor MP30, the potentials V(105;D="0") and V(105;D="1") have therebetween a difference equivalent to the reference voltage Vc.

In this connection, as will be seen from FIG. 4, the waveform 150 of the digital signal D at the input terminal 103 changes in the same direction as the waveform 151 of the potential V(105) at the common node 105.

Therefore, as described in the Ref. USP, the current switching circuit 110 needs for the switching operation simply a small quantity of electricity to be charged and discharged to and from a capacitance $C_{GSMP3}$ between the gate and source electrodes 30b and 30a of the third transistor MP30, as well as to and from a capacitance $C_{GSMP2}$ between the gate and source electrodes 20b and 20a of the second transistor MP20, permitting a switching speed as high as about 100 MHz.

In a practical operation, however, the potential V(105) at the common node 105 varies as shown by the waveform 150 of FIG. 4, so that the reference bias voltage Vc at the input terminal 108 is caused to vary, as shown by the waveform 152 of FIG. 4, by a combination of the gate-source capacitance $C_{GSMP2}$ of the second transistor MP20 and a high impedance of an unshown reference bias source connected to the input terminal 108.

As a matter of course, such variation in the reference bias voltage Vc causes a corresponding variation in the potential V(105) at the common node 5, resulting in a delay of a settling time of the current I, as it is switched.

Therefore, in application to an integrated circuit (hereafter "IC"), to reduce variations of the waveform 152 at the terminal 108, the reference bias voltage Vc is supplied from a bias source having an extremely low impedance, e.g., via a regulator connected to an external bias source.

However, such use of an external bias source requires an increased number of connection pins, particularly in a case of a monolithic IC, in addition to necessary components for the external bias source.

Moreover, the current switching circuit 110 of FIG. 1 may occasionally enter a problematic state such that the second transistor MP20 will not completely turn off, thus resulting in a leak current conducted to the current output terminal 102.

Such a state tends to occur if the potential V(105) at the common node 105 is high when the digital signal D to the input terminal 103 has the low level "0" (ground potential GND).

More specifically, if the potential V(105) is high, the gate-source voltage $V_{GSMP2}$ (=V(105)–Vc) of the second transistor MP20 tends to exceed its set threshold voltage $V_{TMP2}$, causing the second transistor MP20 to be incompletely turned off.

As a countermeasure thereto, the gate-source voltage $V_{GSMP2}$ of the second transistor MP20 may be reduced by increasing the reference voltage Vc applied to the input terminal 108, or, alternatively, the potential V(105) at the common node 105 may be lowered by increasing a ratio W/L of a channel width W to a channel length L of each of the second and third transistors MP20 and MP30.

With the former measure, an output compliance could have become greater, but a drain potential of the first transistor MP10 would have been increased, with a difficulty to meet a necessary condition for a saturation region.

The latter measure would have been accompanied with an undesirable increase in size of the second and third transistors MP20 and MP30.

The present invention has been achieved with such points in mind.

SUMMARY OF THE INVENTION

It therefore is an object of the present invention to provide a current switching circuit operable simply with a single positive-phase digital signal, permitting a high-speed switching action, without an external reference bias and with a reduced number of components.

To achieve the object, a genus of the present invention provides a current switching circuit having a signal input terminal and a current output terminal, the current switching circuit comprising a constant current source connected to a first node, a first switching transistor connected between the first node and a second node, the first switching transistor having a control electrode thereof connected to the signal input terminal, a second switching transistor connected between the first node and the current output terminal, the second switching transistor having a control electrode thereof connected to the second node, and a resistive conduction member interconnected between the second node and a predetermined potential for a resistive current conduction therebetween.

According to the genus of the invention, a constant current source outputs a constant current, which is conducted through a route including a first node, a first switching transistor, a second node and a resistive conduction member, or output through another route including the first node, a second switching transistor and an output terminal. Either, of the routes is selected by a switching action of the first switching transistor receiving at a control electrode thereof a switching control signal input through a signal input terminal and an associated switching of the second switching transistor subjected at a control electrode thereof to a potential developed by the resistive conduction member between the second node and a predetermined potential.

Therefore, according to a genus of the invention, a current switching circuit is implemented to be operable without an external reference bias and with a reduced number of components, in addition to conventional merits.

According to a species of the genus of the invention, the current switching circuit further comprises another constant current source connected to the second node.

According to another species of the genus of the invention, a switching circuit (as a DA converter) comprises a plurality of the above-summarized current switching circuits, a decoder having a plurality of bit-representative signal output terminals, each respectively connected to the signal input terminal of a corresponding one of the plurality of current switching circuits, and a common output terminal connected to the respective current output terminals of the plurality of current switchnig circuits.

According to another species of the invention, a switching circuit (as a voltage level converter) comprises the current switching circuit in which the current output terminal is connected to the predetermined potential and the second node is connected to a voltage output terminal.

According to another species of the invention, the first and second switching transistors each comprise a p-channel MOS transistor, and the predetermined potential represents a ground potential.

According to another species of the invention, the first and second switching transistors each comprise an n-channel MOS transistor, and the predetermined potential represents a power supply voltage.

Therefore, according to the present invention, a current switching circuit of a differential type may not need a conventional external reference voltage source nor connections therefor, while permitting an adaptation to a high-speed switching of, e.g., approximately 100 MHz, with a reduced number of components.

Moreover, according to the present invention, a first switching transistor of a p-channel MOS type and a second switching transistor of a p-channel MOS type may have a remarkably reduced gate size, as well as another p-channel MOS transistor that may constitute a resistive conduction member.

Further, according to the invention, with a constant current source connected to a second node, a potential settling for a switching action may be effectively reduced, permitting a rapid switching.

Furthermore, according to the present invention, a second node connected to a voltage output terminal may provide a low-swing signal having a small amplitude adaptive to a transmission of a high-frequency digital signal with an opposite phase relative to an input signal.

BRIEF DESCRIPTION OF THE ACCOMPANYING DRAWINGS

The objects, features and advantages of the present invention will become more apparent from the consideration of the following detailed description taken in conjunction with the accompanying drawings, in which.

Figure 1:
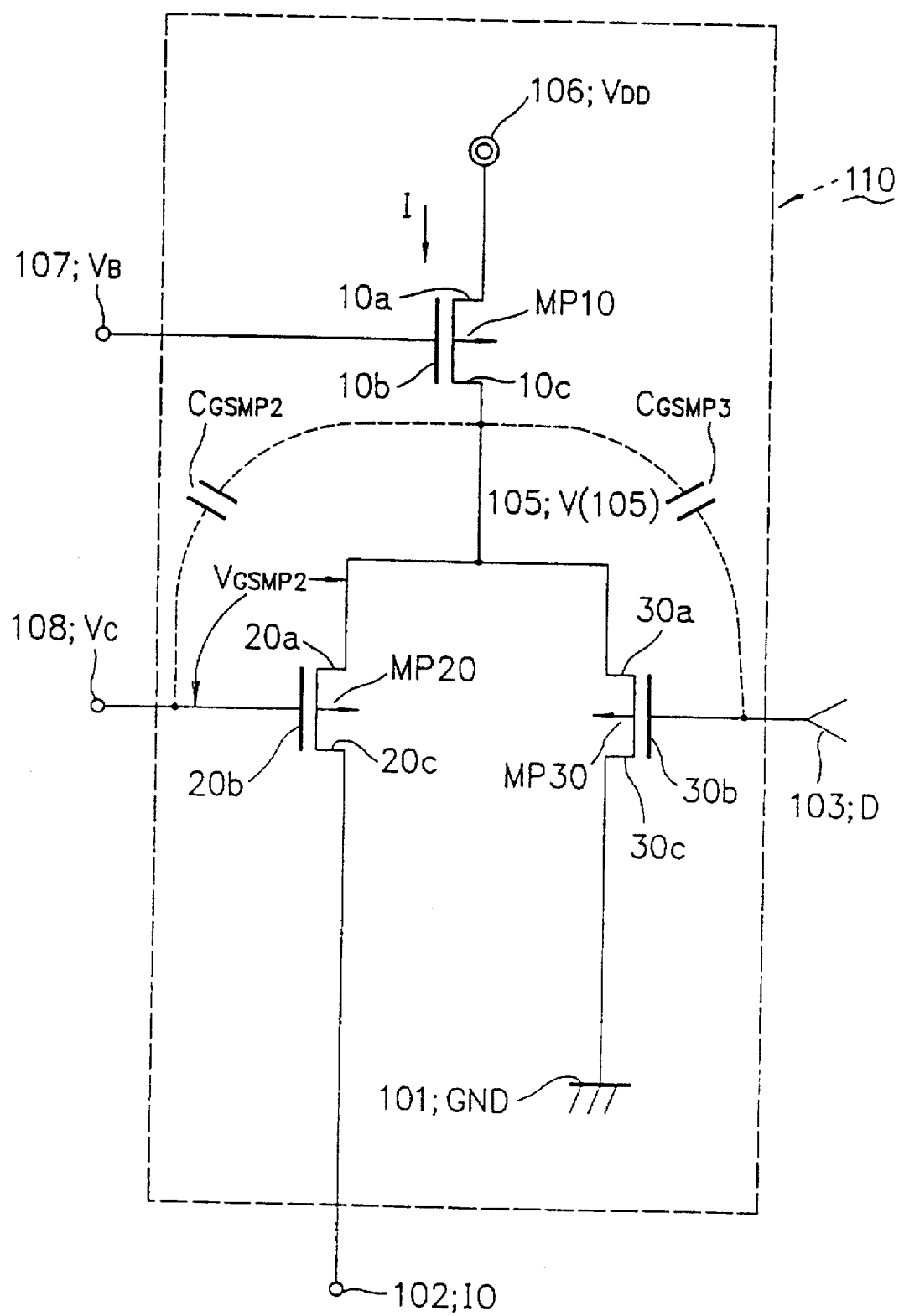
FIG. 1 is a circuit diagram of a conventional current switching circuit.
Figure 2:
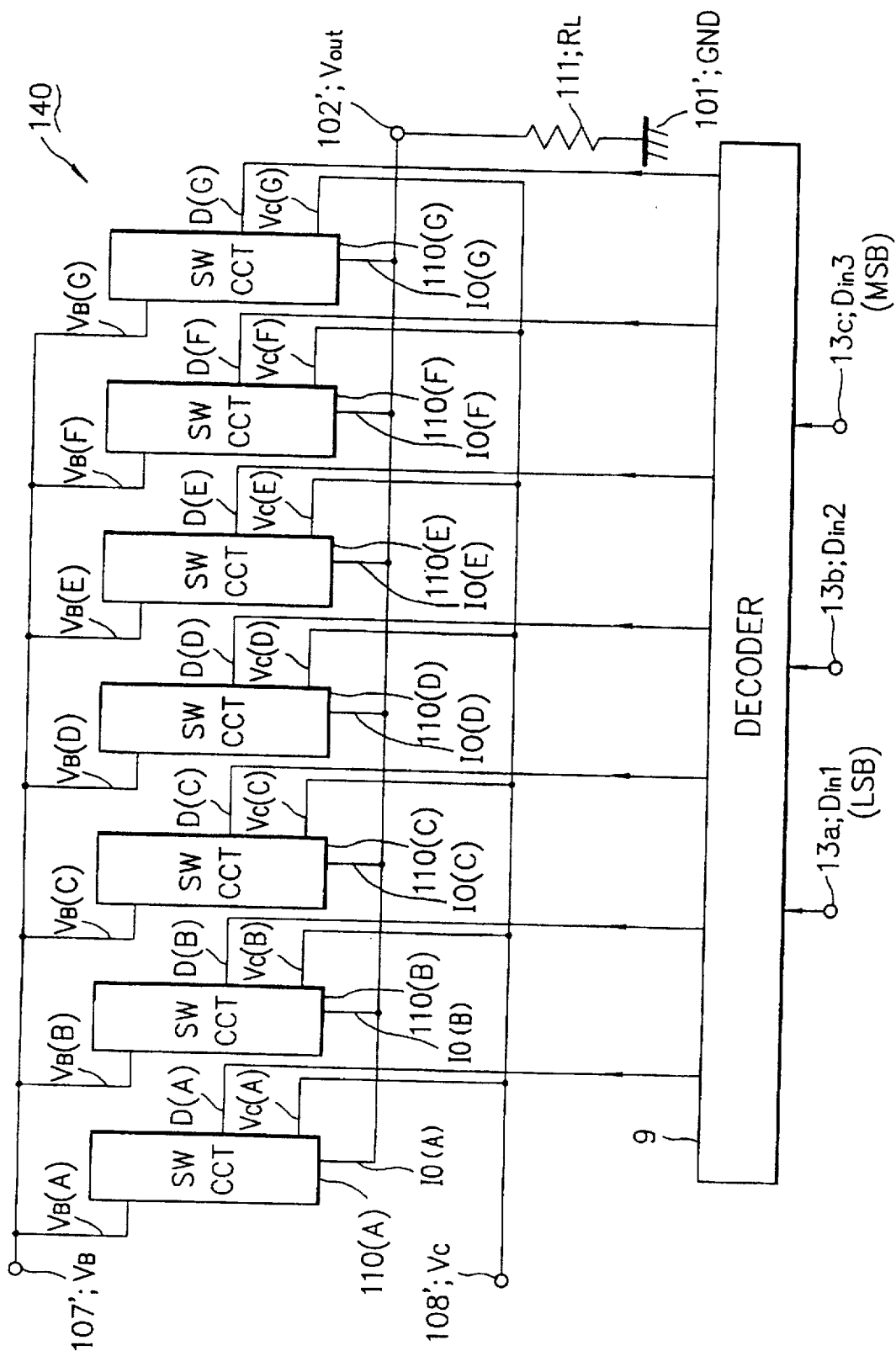
FIG. 2 is a block diagram of a conventional 3-bit DA converter including a plurality of current switching circuits each respectively composed of the circuit of FIG. 1.
Figure 4:
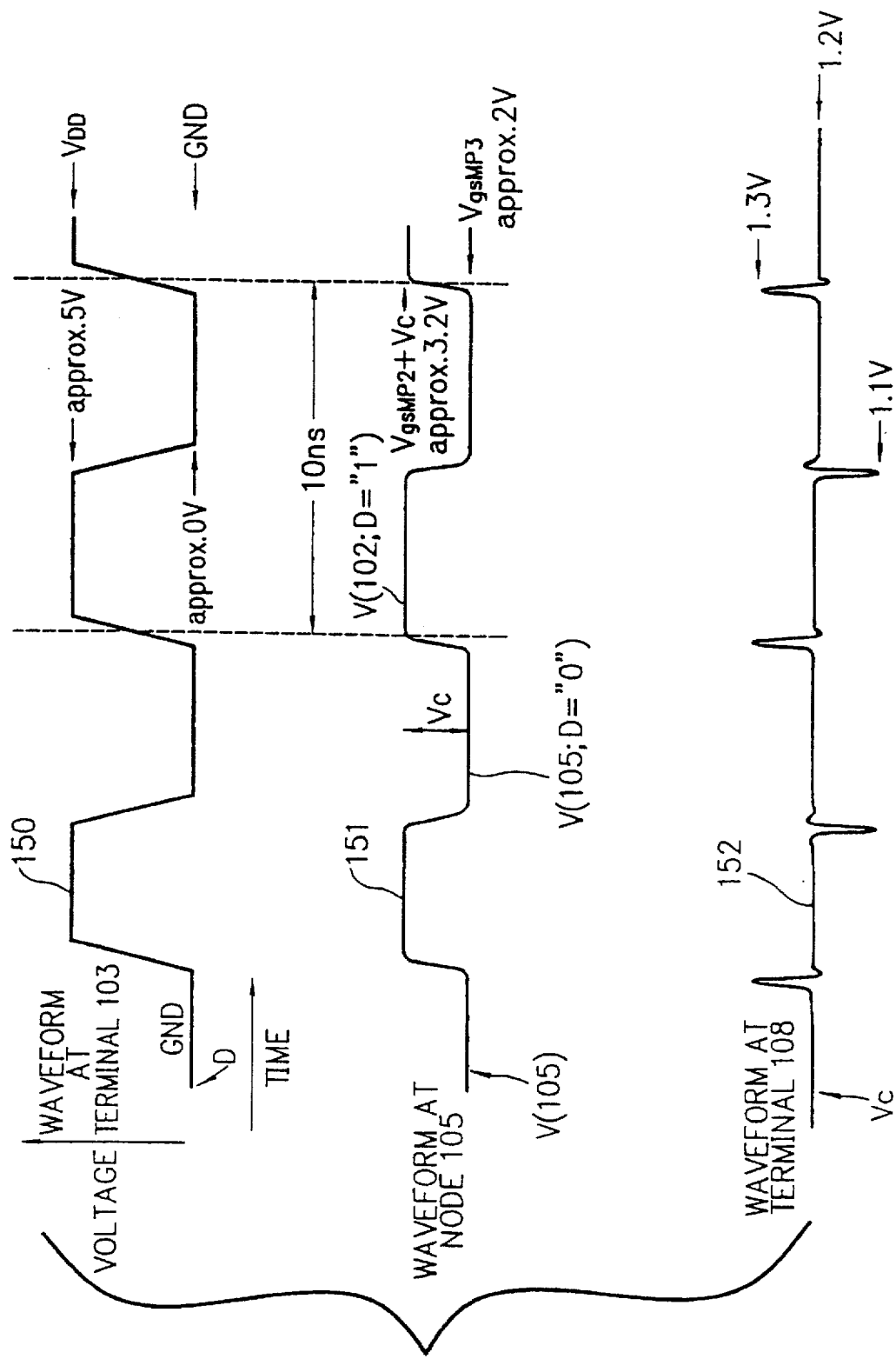
Figure 5:
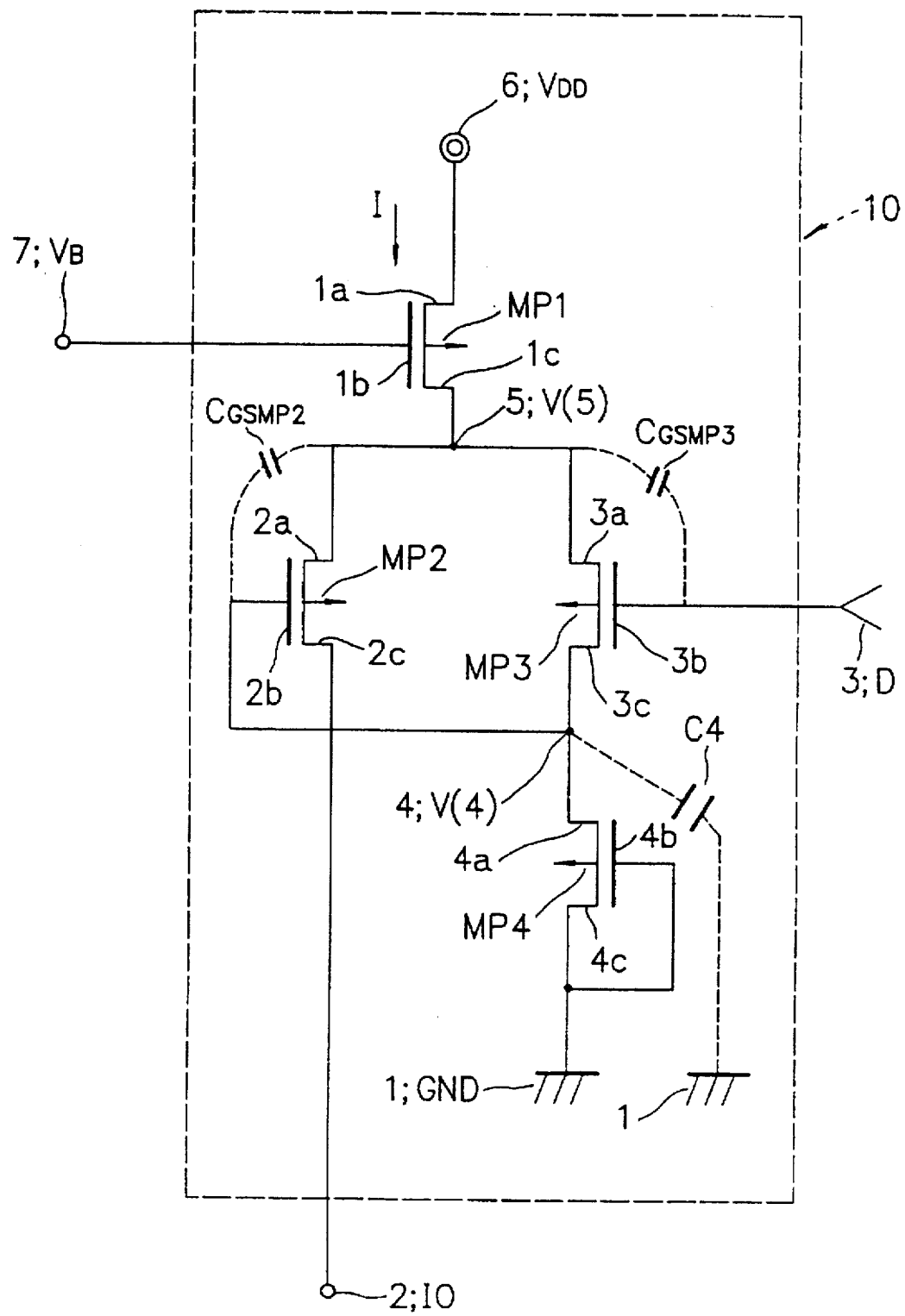
Figure 6:
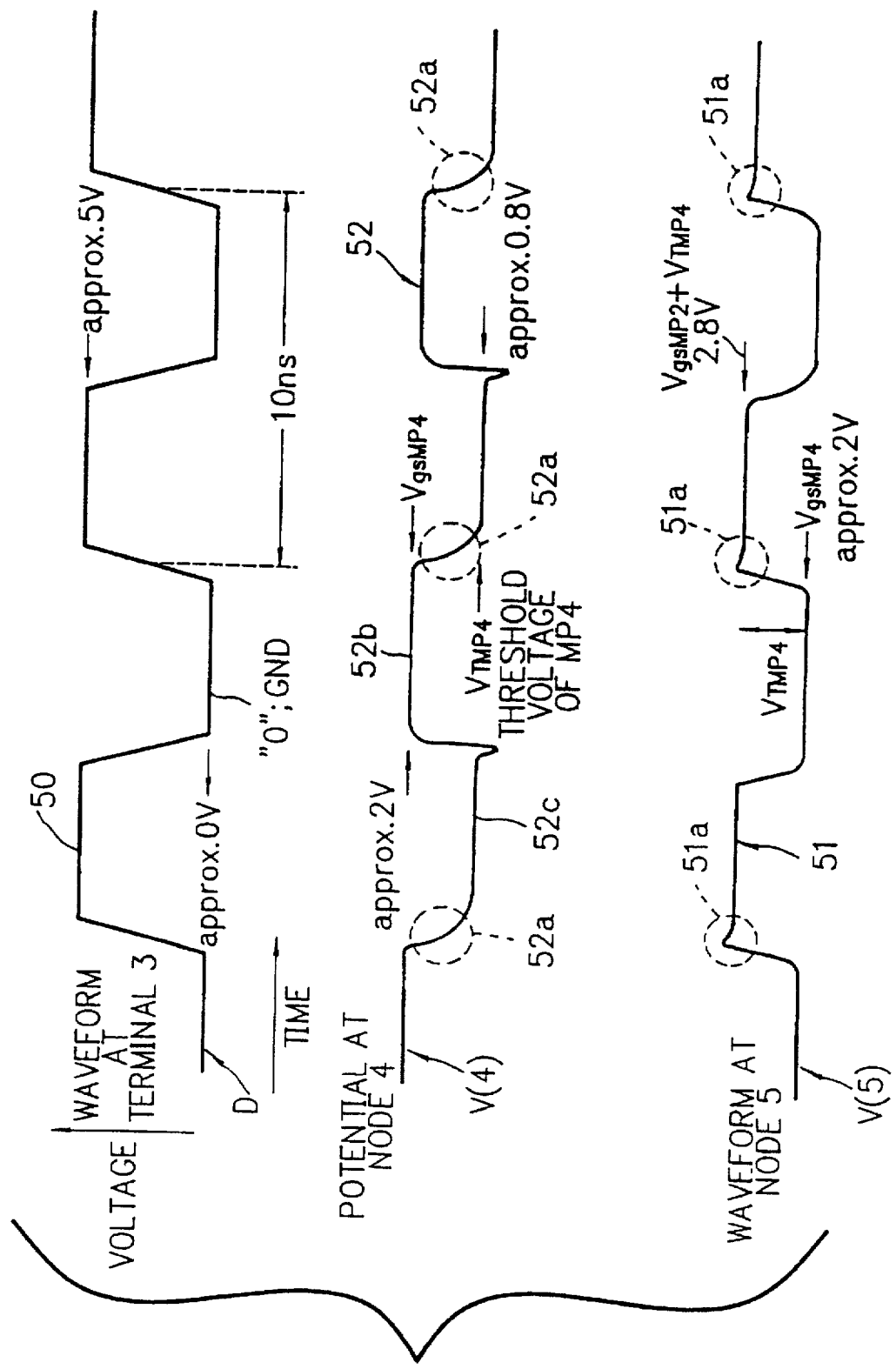
Figure 7:
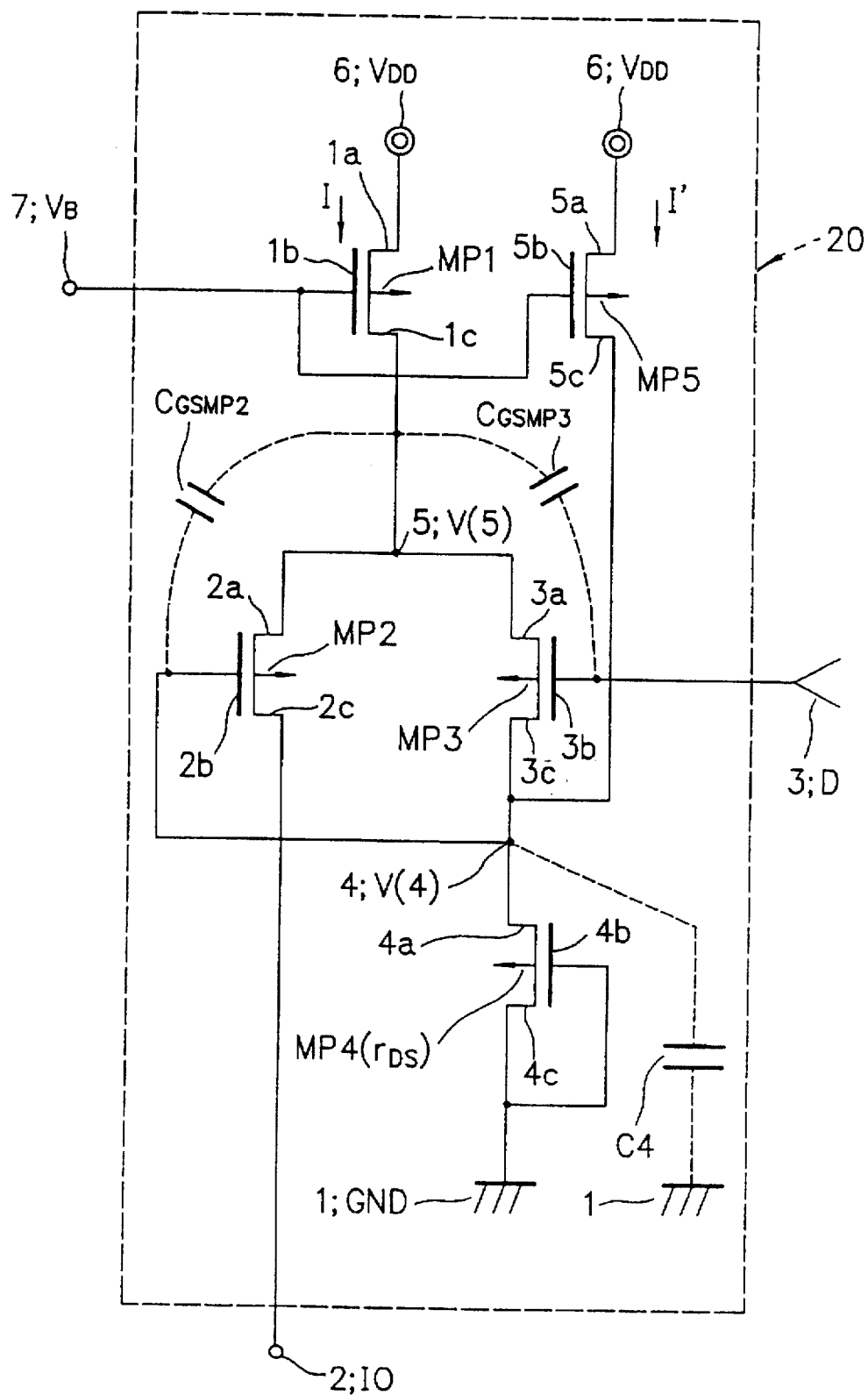
Figure 8:
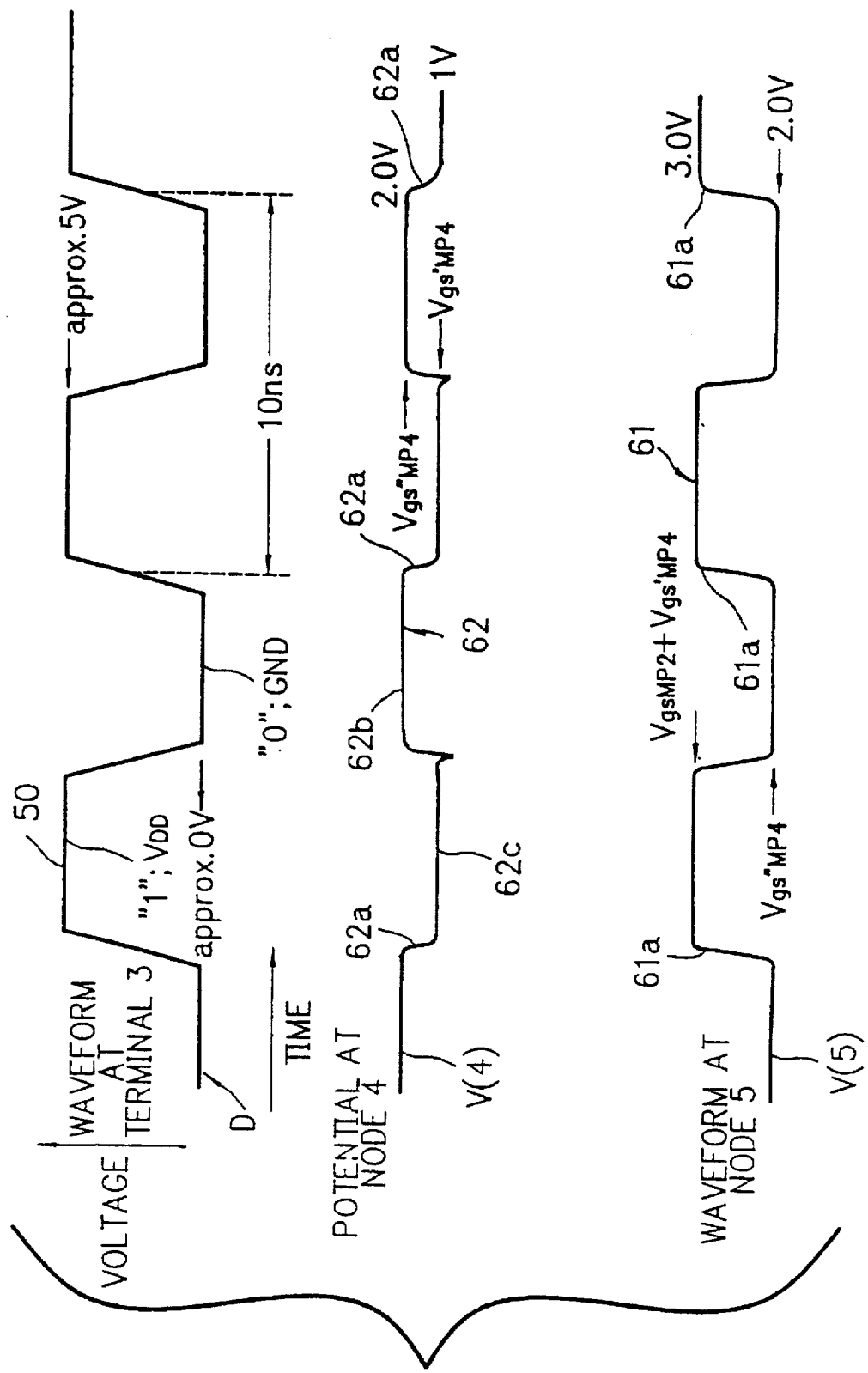
Figure 9:
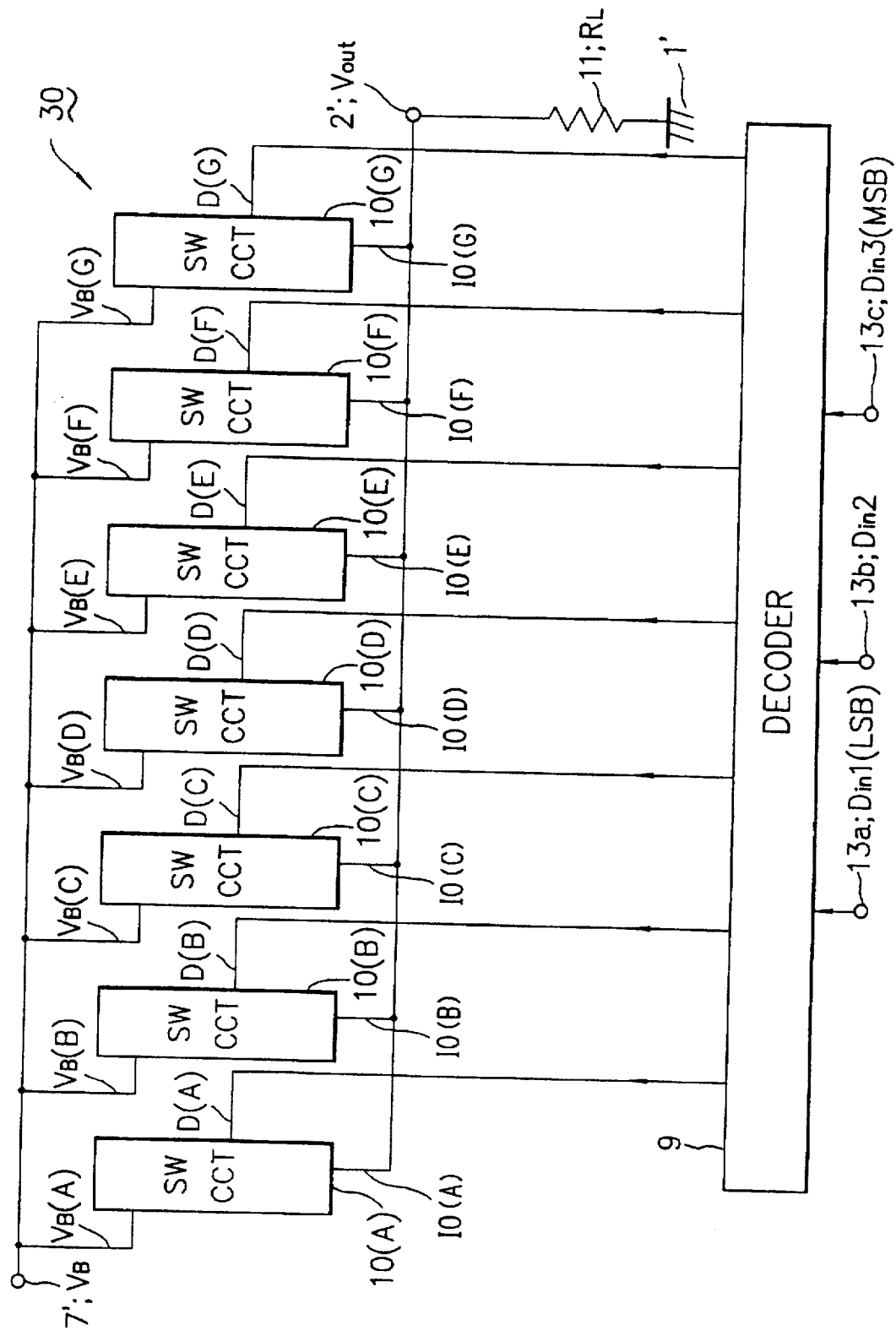
Figure 10:
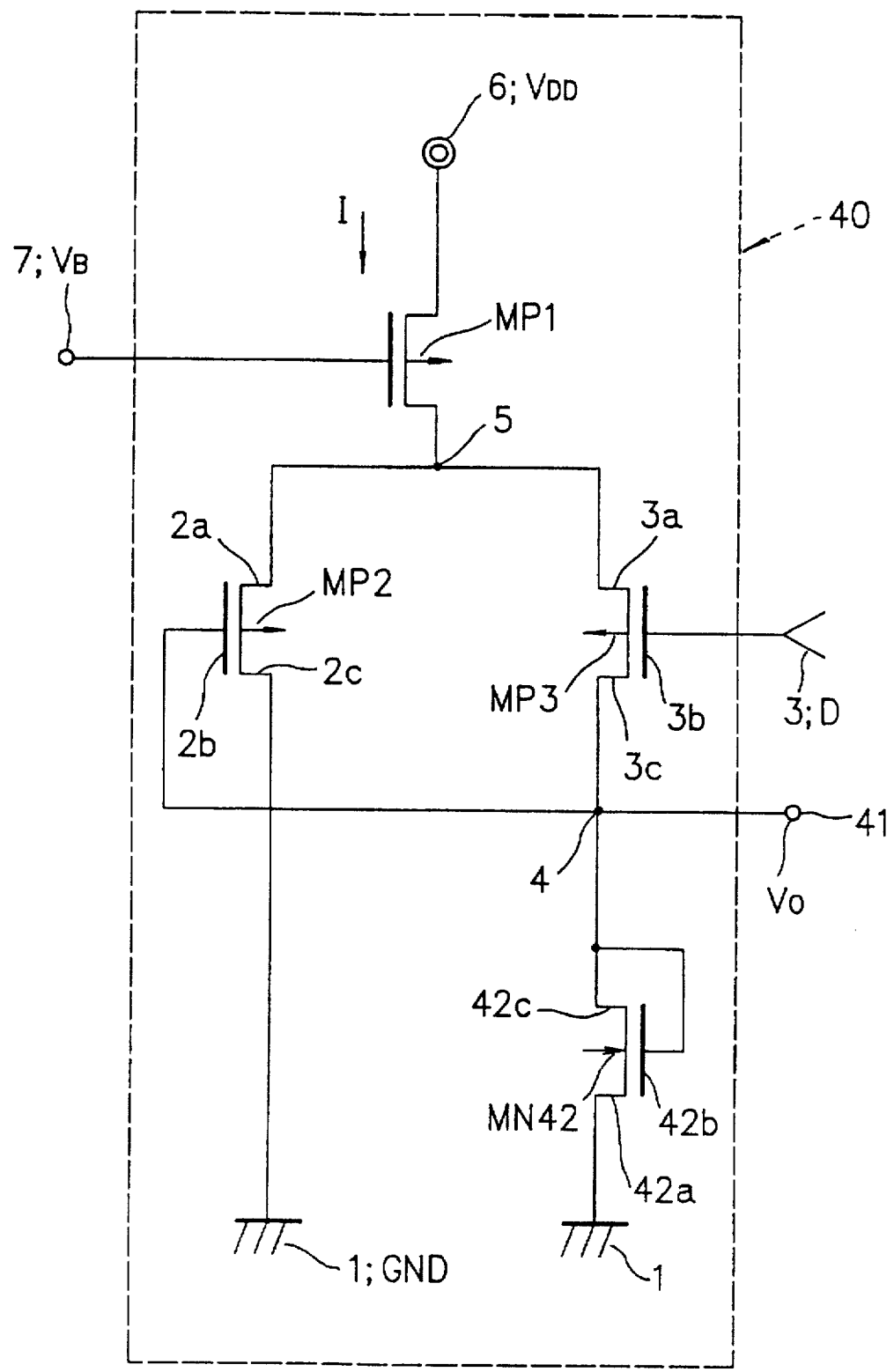
Figure 11:
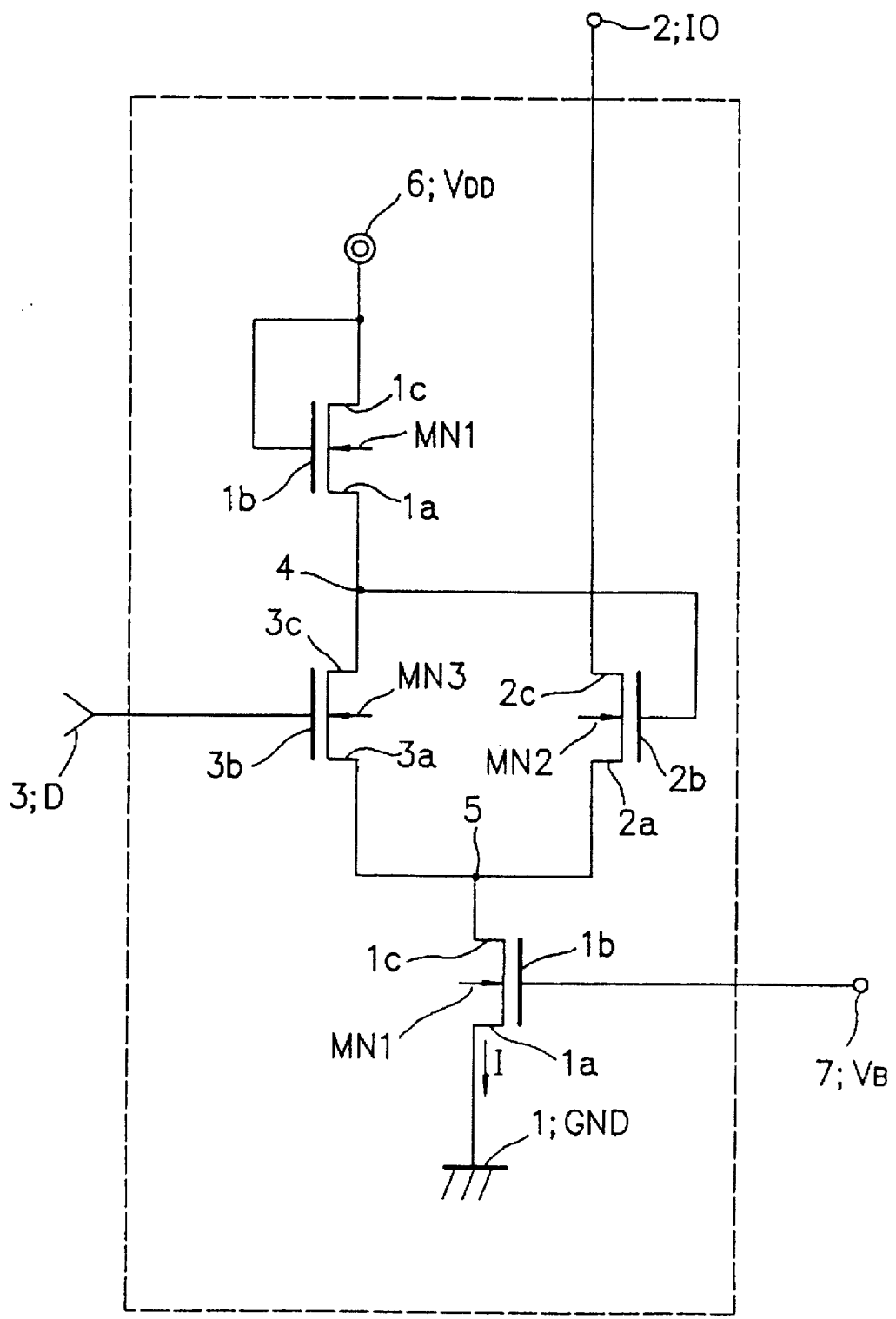

FIG. 3 is a table having listed therein nine combinations of truth values of three bit-representative digital signals Din1 to Din3 input to a decoder employed for a DA conversion in the conventional DA converter of FIG. 2 and in a DA converter according to the present invention, as it is shown in FIG. 9, corresponding combinations of truth values of seven bit-representative digital signals D(A) to D(G) output from the decoder, and corresponding analog output voltages Vout obtained by the DA conversion;

FIG. 4 is a time chart of waveforms of varying potentials at principal terminals and an internal node of the circuit of FIG. 1;

FIG. 5 is a circuit diagram of a current switching circuit according to a preferred embodiment of the invention;

FIG. 6 is a time chart of waveforms of varying potentials at principal terminals and an internal node of the circuit of FIG. 5;

FIG. 7 is a circuit diagram of a current switching circuit according to another preferred embodiment of the invention;

FIG. 8 is a time chart of waveforms of varying potentials at principal terminals and an internal node of the circuit of FIG. 7;

FIG. 9 is a block diagram of a 3-bit D/A converter including a plurality of current switching circuits each respectively composed of the circuit of FIG. 5 or 7;

FIG. 10 is a circuit diagram of a voltage level converter composed of a current switching circuit according to another preferred embodiment of the invention; and FIG. 11 is a circuit diagram of a current switching circuit according to a modification of the embodiment shown in FIG. 5.

DETAILED DESCRIPTION OF THE PREFERRED EMBODIMENTS

The preferred embodiments of the present invention will be detailed below, with reference to FIGS. 5 to 11. Like or corresponding members and corresponding signals are designated by like reference characters.

A first embodiment of the present invention will now be described.

FIG. 5 shows a circuit diagram of a current switching circuit 10 formed on a p-type semiconductor substrate in accordance with the first embodiment.

As shown in FIG. 5, the current switching circuit 10 comprises a total of four p-channel MOS transistors: a first transistor MP1, a second transistor MP2, a third transistor MP3 and a fourth transistor MP4.

The first transistor MP1 has a source electrode 1a connected to a power supply terminal 6 and a gate electrode 1b connected to a bias voltage input terminal 7, which receives an externally supplied bias voltage $V_B$. With the bias voltage $V_B$ applied, the first transistor MP1 serves as a constant current source for generating a current I such that:

$$I=(\tfrac{1}{2})K(W/L)(V_{DD}-V_B-V_{TMP1})^2 \qquad (2),$$

where K is a transconductance of the first transistor MP1, W/L is a ratio of a channel width W to a channel length L of the first transistor MP1, $V_{DD}$ is a potential at the power supply terminal 6, and $V_{TMP1}$ is a threshold voltage set for the first transistor MP1.

The second and third transistors MP2 and MP3 are connected at their source electrodes 2a and 3a to a common interconnection node 5, which connects to a drain electrode 1c of the first transistor MP1.

The second transistor MP2 has a gate electrode 2b connected to an interconnection node 4, which connects to a drain electrode 3c of the third transistor MP3. The second transistor MP2 is connected at a drain electrode 2c thereof to a current output terminal 2.

The third transistor MP3 is connected at a gate electrode 3b thereof to a switching control signal input terminal 3, which receives an externally supplied digital signal D as a switching control signal.

The second and third transistors MP2 and MP3 cooperate with each other for responding to a voltage level of the digital signal D to switch a conduction route of the current I generated at the first transistor MP1, so that the current I flows along a selected one of a left path (in FIG. 5) extending from the common node 5 through the second transistor MP2 to the output terminal 2 and a right path (in FIG. 5) extending from the common node 5 through the third transistor MP3, the interconnection node 4 and the fourth transistor MP4 to a ground terminal 1 having a ground potential GND.

The fourth transistor MP4 is connected at a source electrode 4a thereof to the node 4, and at a drain electrode 4c thereof to the ground terminal 1. The drain electrode 4c of the fourth transistor MP4 is short-circuited to a gate electrode 4b of the same transistor MP4 so that this transistor MP4 works as a para-diode.

Actions of the current switching circuit 10 will be described with reference to FIGS. 5 and 6.

FIG. 6 is a time chart describing a waveform 50 of the digital signal D at the input terminal 3, a waveform 51 of a potential V(5) at the common node 5 and a waveform 52 of a potential V(4) at the interconnection node 4.

When the digital signal D input as a switching control signal to the terminal 3 has a low level "0" equivalent to the ground potential GND, the third transistor MP3 is turned on so that the current I is conducted along the right conduction route 5-MP3-MP4-1, i.e. through the third transistor MP3 and the fourth transistor MP4 cascaded thereto.

When conducting the current I, the fourth transistor MP4 is operable in a saturation region thereof as the drain electrode 4c is short-circuited to the gate electrode 4b.

When acting in the saturation region, the fourth transistor MP4 has between the source and gate electrodes 4a and 4b thereof a voltage difference $V_{GSMP4}$ of which an absolute value $|V_{GSMP4}|$ develops such that:

$$|V_{GSMP4}|=\{2I/[K(W/L)]\}^{1/2}+V_{TMP4} \qquad (3),$$

where K is a transconductance of the fourth transistor MP4, $V_{TMP4}$ is a threshold voltage set for the transistor MP4, and (W/L) is a size ratio of a channel width W to a channel length L of the transistor MP4.

The above expression (3) indicates that, when conducting the current I, the fourth transistor MP4 has a gate-source voltage $V_{GSMP4}$ larger in absolute value than the threshold voltage $V_{TMP4}$.

To this point, as the gate electrode 3b of the third transistor MP3 is at the low level "0" equivalent to the ground potential GND, the third transistor MP3 has between the gate and drain electrodes 3b and 3c thereof a voltage difference identical in absolute value to the gate-source voltage $V_{GSMP4}$ of the fourth transistor MP4.

In other words, the third transistor MP3 has at the drain electrode 3c a potential higher than the ground potential GND at the gate electrode 3b by a difference exceeding the threshold voltage, so that the transistor MP3 is caused to operate in a non-saturation region.

When operating in the non-saturation region, the third transistor MP3 has a far lower resistance than when in a saturation region, so there is developed a small potential difference of, e.g., 0.1V or less between the drain and source electrodes 3c and 3a of the transistor MP3.

As will be seen from connections at the nodes 4 and 5 in FIG. 5, the drain-source voltage (between 3c and 3a) of the third transistor MP3 must be equivalent to that (between 2c and 2a) of the second transistor MP2, when the (2c–2a) voltage should be lower than a threshold voltage of the transistor MP2 so that this transistor MP2 is completely turned off.

Accordingly, the current I generated at the first transistor MP1 is wholly conducted along the right route 5-MP3-MP4-1, i.e., via the third transistor MP3.

On the other hand, when the digital signal D input to the terminal 3 has a high level "1" equivalent to the power supply voltage $V_{DD}$, the third transistor MP3 is completely turned off, conducting no current therethrough.

Since no current is conducted along the right route 5-MP3-MP4-1, the gate-source voltage $V_{gsMP4}$ (between 4b [grounded] and 4a) of the fourth transistor MP4 that is expressed by the expression (3), of which a first term then becomes null, has an absolute value equivalent to the threshold voltage $V_{TMP4}$ of the transistor MP4, so that a corresponding source potential $V_{TMP4}$ (at 4a) is applied as a bias V(4) to the gate electrode 2b of the second transistor MP2.

Assuming the second transistor MP2 to be a typical p-channel MOS FET that has a threshold voltage of about 0.8V (corresponding to a $0.2V_{DD}$ or near in a typical process), this transistor MP2 is turned on, conducting the current I therethrough, i.e., along the left route 5-MP2-2.

Accordingly, the circuit 10 of FIG. 5 acts for a switching of the current I, depending on a level of the digital signal D input as a switching control signal to the terminal 3.

In FIG. 6, the waveforms 52 and 51 of the potentials V(4) and V(5) describe their variations along according to switching actions of the circuit 10 in which the second and fourth transistors MP2 and MP4 are assumed to be identical in size to each other.

A comparison between the circuit 10 of FIG. 5 and the circuit 110 of FIG. 1 will be discussed with reference to waveforms in FIG. 6 and corresponding waveforms in FIG. 4.

For a better comprehension, it is now assumed that in the circuit 110 of FIG. 1 the reference voltage Vc has a level of 1.2 V at the gate bias input terminal 108 of the second transistor MP20 and that the second or third transistor MP20 or MP30, as it is selected for conducting the current I, has a gate-source voltage $V_{gsMP2}$ or $V_{gsMP3}$ of about 2 V.

Moreover, like assumption is made of the gate-source voltgaes of the second and third transistors MP2 and MP3 in the circuit 10 of FIG. 5.

Further, it is assumed that in the circuit 10 of FIG. 5 the second and fourth transistors MP2 and MP4 both have a threshold voltage of 0.8 V (as $V_{TMP2}$ and $V_{TMP4}$, respectively) and that, when conducting the current I, the selected one MP2 or MP4 of them has a gate-source voltage of 0.8 V (as $V_{gsMP2}$ or $V_{gsMP4}$, respectively).

As will be seen from FIGS. 4 and 6, the waveform 152 of the reference voltage Vc at the gate bias terminal 108 of the second transistor MP20 in the circuit 110 is substantially flat, kept at the 1.2 V level, and the waveform 52 of the potential V(4) to be applied as a bias from the node 4 to the gate electrode 2b of the second transistor MP2 in the circuit 10 varies substantially with an amplitude of about 1.2 V, i.e. within a potential range between a low level of 0.8 V and a high level of 2 V.

However, the waveform 151 of the potential V(105) at the node 105 common to the sources 20a and 30a of the second and third transistors MP20 and MP30 in the circuit 110 is varied as a rectangular wave with an amplitude of 1.2 V, i.e., within a range between a low level of 2 V and a high level of 3.2 V, and the waveform 51 of the potential V(5) at the common node 5 between the source electrodes 2a and 3a the second and third transistors MP2 and MP3 in the circuit 10 varies as a substantially rectangular wave within a potential range between a low level of 2 V and a high level of 2.8 V.

Therefore, a high speed switching is permitted in the circuit 10 of FIG. 5, like the circuit 110 of FIG. 1 in which the quantity of electricity to be charged and discharged to and from the second or third transistor MP20 or MP30 is controlled to be small due to a parasitic capacitance $C_{GSMP2}$ or $C_{GSMP4}$ that the second or third transistor MP20 or MP30 has between the gate and source electrodes 20b-20a or 30b-30a, respectively.

Moreover, in the circuit 10 of FIG. 5, as the digital signal D is input at the low level "0" to the input terminal 3, the third transistor MP3 is turned on to be operable in the non-saturation region, with a small voltage difference developed between the drain and source electrodes 3c and 3a.

Accordingly, the second transistor MP2 has between the gate and source electrodes 2b and 2a a voltage difference $V_{GSMP2}$ smaller than the threshold voltage $V_{TMP2}$ thereof.

Thus, unlike the conventional circuit 110, no leak current flows in the left conduction route 5-MP2-2 when the third transistor MP3 is turned on.

Further, as a significant advantage of the embodiment, the circuit 10 of FIG. 5 does not need an external reference bias source necessitated in the circuit 110 of FIG. 1 to supply the second transistor MP20 with the reference voltage Vc.

A second embodiment of the present invention will be described with reference to FIGS. 7 and 8.

FIG. 7 is a circuit diagram of a current switching circuit 20 according to the second embodiment. FIG. 8 is a time chart of signal waveforms 50, 61 and 62 corresponding to the waveforms 50, 51 and 52 of FIG. 6, respectively.

The second embodiment shown in FIG. 7 is similar to the first embodiment shown in FIG. 5 so that the current switching circuit 20 has respective advantageous features of the circuit 10 and additional advantages such as an improved switching speed.

The second embodiment of FIG. 7 differs from the first embodiment of FIG. 5 in that between the power supply terminal 6 and the interconnection node 4 between the third and fourth transistors MP3 and MP4 (in FIG. 5), a fifth transistor MP5 is connected as an additional constant current source, with a source electrode 5a, a gate electrode 5b and a drain electrode 5c thereof connected to a power supply terminal 6 having a power supply voltage $V_{DD}$, a bias voltage input terminal 7 having an externally input bias voltage $V_B$ and the node 4, respectively, so that a constant current I' is generated to be output from the drain electrode 5c to the node4 (in FIG. 7).

With such a configuration, the second embodiment is permitted to exhibit an advantageous effect such that, along length of a rounded transient portion 52a at each falling edge of the substantially rectangular waveform 52 of the potential V(4) at the interconnection node 4 (in FIG. 6), a fall time is effectively reduced, obtaining the waveform 62 refined to be rectangular with defined fall edges 62a (in FIG. 8).

This effect accompanies another advatageous effect such that an overshoot 51a at each rising edge of the substantially rectangular waveform 51 of the potential V(5) at the common node 5 (in FIG. 6) is effectively reduced, resulting in the waveform 61 refined to be rectangular with defined rising edges 61a (in FIG. 8).

Accordingly, the current switching circuit 20 of FIG. 7 is permitted to have a significantly increased switching speed.

A function of the fifth transistor MP5 will be discussed.

By the provision of the fifth transistor MP5 which outputs the current I' to the node 4, even when a third transistor MP3 is turned off, a fourth transistor MP4 is permitted to have between source and drain electrodes 4a and 4c thereof a resistance $r_{SD}$ (to a current conduction therethrough) reduced to render small a time constant as a product $r_{DS} \cdot C_4$ thereof by a parasitic capacitance $C_4$ between the node 4 and a ground terminal 1 having a ground potential GND.

The fourth transistor MP4 comprises a typical p-channel MOS FET having gate and drain electrodes 4b and 4c short-circuited to each other so that, when the third transistor MP3 is turned off, the source-drain resistance $r_{SD}$ of the fourth transistor MP4 depends on the current I' conducted therethrough such that:

$$r_{SD}(=1/gm)=1/[2'K(W/L)]^{1/2} \quad (4),$$

where gm is a conductance.

Therefore, if the source-drain current I' is null, the source-drain resistance $r_{SD}$ is infinite. However, as the current I' increases, the resistance $r_{SD}$ decreases to a certain extent, depending on the expression (4).

In the circuit 20 of FIG. 7, the current I' generated at the fifth transistor MP5 and output to the interconnection node 4 is controlled to be sufficiently smaller than a current I from a first transistor MP1, to obtain the waveforms 61 and 62 in FIG. 8.

More specifically, in the circuit 20, a sum of the constant currents I and I' conducted through the fourth transistor MP4 provides the interconnection node 4 with a potential V(4), i.e., a high level 62b (=$V_{gs-MP4}$) of waveform 62 (FIG. 8), substantially equivalent to the potential that the node 4 of the circuit 10 has when it conducts the current I, i.e., a high level 52b (=$V_{gsMP4}$) of the waveform 52 (FIG. 6).

As shown in FIG. 8, the waveform 62 of the potential V(4) at the interconnection node 4 between the third and fourth transistors MP3 and MP4 is varied between a low level 62c (=$V_{gsMP4}$), which is higher than a low level 52c (=$V_{TMP4}$) of the waveform 52 (FIG. 6) by a fraction (=$V_{TMP4}-V_{TMP4}$) due to a contribution of the current I' supplied from the fifth transistor MP5 in addition to the current I supplied from the first transistor MP1, and the high level 62b substantially equivalent to the high level 52b of the waveform 52 (FIG. 6).

Accordingly, in the circuit 20, the potential V(4) at the node 4 varies with a reduced amplitude.

Moreover, as the fall time also is reduced, the fall edge 62a of the waveform 62 is defined as described.

Further, as will be seen from FIG. 8, when compared with the first embodiment, the current switching circuit 20 of FIG. 7 has at each of the nodes 4 and 5 a reduced potential settling time upon an on-off switching thereof.

The current switching circuits 10 and 20 of FIGS. 5 and 7 may each preferably be employed to constitute a DA converter.

In this repect, FIG. 9 shows an exemplary 3-bit DA converter 30 including a total of seven current switching circuits 10(A) to 10(G), each respectively composed of the circuit 10 of FIG. 5.

The DA converter 30 of FIG. 9 is similar in block arrangemment and connection to the conventional DA converter 140 of FIG. 2. Like members and signals are designated by like or corresponding reference characters.

The DA converter 30 is different from the DA converter 140 in that the seven current switching circuits 110(A) to 110(G) in the converter 140 are replaced by the circuits 10(A) to 10(G) in the converter 30, and that the common terminal 108' supplied with the reference voltage Vc and associated connections to the circuits 110(A) to 110(G) of the converter 140 are omitted in the converter 30.

In other words, the DA converter 30 comprises a 3-input/7-output decoder 9 controlled in accordance with the table of FIG. 3, and the seven current switchnig circuits 10(A) to 10(G) which receive their bias voltages $V_B(A)$ to $V_B(G)$ from a common bias terminal 7' and receive their switching control signals D(A) to D(G) through output connections of the decoder 9 and of which output currents 10(A) to 10(G) are collected at an analog voltage output terminal 2', where terminal 2' is connected to a ground terminal 1' through a load resistor 11.

Incidentally, it will be seen that in the first and second embodiments the fourth transistor MP4 may preferably be substituted with a diode or a resistor.

The current switching circuit 10 and 20 may each be operated at a switching speed higher than, for example 100 MHz for example. It may be advantageous for a high-speed oscillating signal to be controlled to have a reduced amplitude so that the signal can be externally output with a reduced noise level.

In this connection, as will be detailed later, the current switching circuit 10 and 20 may each preferably be employed to constitute a level shift circuit for an external transmission of a high-frequency digital signal.

In the conventional current switching circuit 110, the second transistor MP20 may occasionally be incompletely turned off, causing a leakage current, as described.

To avoid causing such a leakage current, and to provide a reduced size to the second and third transistors MP20 and MP30 as well, the conventional circuit 110 needs a voltage of about 1.2 V to be applied as a higher voltage than necessary to the gate electrode 20b of the second transistor MP20.

In this respect, more specifically with respect to a gate voltage range of the second transistor MP20, there is a necessary condition to be met, as described below with reference to FIGS. 1 and 4.

The DA converter in general has an output compliance specified therefor in terms of a permissible maximum value of an analog output voltage (e.g. Vout at the terminal 102' in FIG. 2 or the terminal 2' in FIG. 9) to guarantee an accuracy range of an associated output current. For high-speed DA converters ranging around 100 MHz or more, the output compliance substantially fails within a range of approximately 1 V to 1.5 V.

Assuming a maximal 1.5 V as the output compliance, and letting $V_{TMP2}$ be a threshold voltage meeting a known requirement for the saturation region of the second transistor MP20, the reference bias voltage Vc to be applied to the input terminal 108 of the circuit 110 should meet a condition defined by expression (5) such that:

$$Vc>(\text{the output compliance})-V_{TMP2},$$

or $$Vc>1.5 \text{ V}-0.8 \text{ V}=0.7 \text{ V} \quad (5).$$

Therefore, as a necessary condition, the reference voltage Vc and hence the gate voltage of the second transistor MP20 has to exceed a critical level of 0.7 V.

In the conventional circuit 110, the gate voltage of about 1.2 V meets this condition as a matter of course, but in excessively redundant manner, unnecessarily securing an allowance as large 0.5 V (=1.2 V−0.7 V).

To this point, assuming correspondent design parameters in the circuit 10 of FIG. 5, such the necessary condition is met with an effective small allowance of approximately 0.1 V, as the fourth transistor MP4 has a threshold voltage $V_{TMP4}$ of about 0.8 V to be applied as a gate voltage to the second transistor MP2, when this transistor MP2 is turned on.

Description will be made of a gate size of the second, third and fourth transistors MP2, MP3 and MP4 in the current switching circuit 10 of FIG. 5, in comparison with the conventional circuit 110 of FIG. 1.

In the conventional circuit 110, when the third transistor MP30 is turned on with the second transistor MP20 turned off, the potential V(105) at the common node 105 needs to meet the following condition, as described in conjunction with a problem of the prior art.

$$V(5)<Vc+V_{TMP2}$$

V(5)<1.2 V+0.8 V=2.0 V    (6).

This expression (6) indicates that when the current I is conducted through the third transistor MP30, the gate-source voltage $V_{gsMP3}$ should be lower than 2 V.

Similarly, in the circuit 10 of FIG. 5, assuming 5 V as the potential $V_{DD}$ at the power supply terminal 6 and 3 V as the bias voltage $V_B$ at the input terminal 7, the potential V(5) at the common node 5 may well be under about 3 V, as the first transistor MP1 is allowed to operate in a saturation region.

In this connection, the third transistor MP30 in the circuit 110 of FIG. 1 serves for the switching as described and additionally for a provision of necessary potential, which is performed by the fourth transistor MP4 in the circuit 10 of FIG. 5 as well as in the circuit 20 of FIG. 7.

Therefore, in the circuit 110 of FIG. 1, the gate-source voltage $V_{gsMP3}$ has a level under 2 V or near, as the current I is conducted through the third transistor MP30.

In the circuit 10 of FIG. 5, the gate-source voltage $V_{gsMP4}$ is controlled to be under 3 V approximately, as it depends on the expression (3) including a first term $2I/[K(W/L)]^{1/2}$.

On the assumption for similarity at associated electrode regions, a differential of the first term of the expression (3) may be applied to evaluate a difference between the gate-source voltage $V_{gsMP3}$ of the third transistor MP30 of the circuit 110 and the gate-source voltage $V_{gsMP4}$ of the fourth transistor MP4 of the circuit 10.

More specifically assuming between the circuits 110 and 10 an identical current I and a substantially identical transconductance K, the gate-source voltages $V_{gsMP3}$ and $V_{gsMP4}$ have a difference therebetween substantially depending on a difference in value of a ratio of W/L.

Letting the ratio W/L of the circuit 110 be unity, the gate-source voltage $V_{gsMP4}$ of the fourth transistor MP4 in the circuit 10 may be achieved by a size setting of the first term of the expression (3) times a factor of about 0.55, i.e. a square times 0.3 or near in terms of a ratio W/L of the transistor MP4.

The current switching circuit 10 of FIG. 5 as well as the current switching circuit 20 of FIG. 7 includes as an essential component thereof the third transistor MP3 in addition to the fourth transistor MP4.

In a conductive state, the third transistor MP3 is allowed to operate in the non-saturation region so that the transistors MP3 and MP4 may well be substantially identical to each other with respect to the gate size in concern.

As a result, in both the first and second embodiments of the invention, the second and third transistors MP2 and MP3 as a pair of current switching members and the fourth transistor MP4 as a resistive conduction member may be fabricated with a gate size substantially equivalent to one third of that of a conventional gate size.

A third embodiment of the present invention will be described with reference to FIG. 10.

FIG. 10 is a circuit diagram of a voltage level converter circuit or a level shifter circuit as a current switching circuit 40 according to the third embodiment.

As shown in FIG. 10, in the third embodiment, a drain electrode 2c of a second transistor MP2 is connected to a ground terminal 1, without providing the current output terminal 2 of FIG. 5, and an interconnection node 4 between a third transistor MP3 and an n-channel MOS transistor MN42 as a fourth transistor is provided with a voltage output terminal 41 for outputting therefrom an analog voltage Vo.

With such an arrangement, the circuit 40 works as a level converter in which an input level of a digital signal D that ranges from a ground potential GND to a potential $V_{DD}$ of a power supply terminal 6 is reduced to a small amplitude of about one volt.

The fourth transistor MN42 is connected at a source electrode 42a thereof to the ground terminal 1 and at a drain electrode 42c thereof to the interconnection node 4, while the drain electrode 42c is short-circuited to a gate electrode 42b of the transistor MN42.

The voltage Vo developed at the output terminal 41 has a waveform substantially identical in form to the waveform 52 of the potential V(4) shown in FIG. 6.

However, the voltage Vo to be output from the terminal 41 is opposite in logical value to the digital signal D input to a switching signal input terminal 3.

In the foregoing embodiments of the invention, the respective current switching circuits 10, 20 and 40 are each constituted with p-channel MOS transistors MP, excpet MN42. Those transistos MP can however be replaced by n-channel MOS transistors MN to achieve similar effects.

FIG. 11 shows a modification of the first embodiment (FIG. 5), in which the first to fourth p-channel transistors MP1 to MP4 in FIG. 5 are replaced by first to fourth n-channel transistors MN1 to MN4 in FIG. 11, respectively, and associated polarity relationships are reversed. Like members and signals are designated by like characters.

In other words, a first n-channel MOS transistor MN1 as a constant current source is connected between a ground terminal 1 and a node 5 common to source electrodes 2a and 3a of second and third n-channel MOS transistor MN2 and MN3, and a fourth n-channel MOS transistor MN4 in which a drain electrode 4c is short-circuited to a gate electrode 4b is connected as a resistive conduction member between a drain electrode 3c of the third transistor MN3 and a power supply terminal 6.

Further, a gate electrode 3b of the third transistor MN3 is connected to a switching digital signal input terminal 3, a drain electrode 2c of the second transistor MN2 is connected to an analog current output terminal 2, and a gate electrode 1b of the first transistor MN1 is connected to a bias input terminal 7.

The present invention has been described in conjunction with the respective embodiments thereof. However, the present invention is not restricted by the depicted embodiments. The present invention includes various other modes of embodiments according to the principle of the invention.

In accordance with the present invention described above, there can be provided a current switching circuit which achieves a high-speed switching operation for, for example, 100 MHz without necessitating the reference voltage source required in the differential-type current switching circuit of the prior art.

Furthermore, in accordance with the present invention, since the reference voltage source is unnecessary, it is not required to provide the reference voltage input terminal used in the conventional example. As a result, the number of externally arranged parts can be reduced.

Additionally, in the conventional example, to prevent the leakage current due to incompleteness of the off state of the second p-channel MOS transistor and to minimize the size of the second and third p-channel MOS transistors MP2 and MP3, the gate voltage applied to the second transistor MP2 is set to a high value of about 1.2 V (reference voltage Vc) which is not required in an ordinary operation.

Still more, in FIGS. 1 and 2, there is a condition for the gate voltage of second transistor MP2, as follows.

The output compliance defined as a maximum analog output voltage to guarantee the precision of the current output of the analog output voltage Vout from the D/A converter is considered to be about 1 V to about 1.5 V.

Assuming the output compliance to be 1.5 V, the reference voltage Vc input to the reference voltage input terminal 8 of the conventional example need only exceed 0.7 V according to expression (5) in which $V_{TMP2}$ indicates the threshold voltage value of the second transistor MP2 satisfying the condition of the saturated region of the transistor MP2.

In accordance with the present invention, when the second transistor MP2 is on, the gate voltage is equal to the threshold voltage $V_{TMP4}$ of MP4≈0.8 V, satisfying expression (5).

Since the operation is conducted in the non-saturated region when the third transistor MP3 is on in accordance with the present embodiment, it is possible to prevent the leakage current flowing from the current output terminal.

Moreover, assuming that the W/L ratio of the third transistor MP3 to be unity in the conventional example, the first term of expression (3) need only be multiplied by about 0.55 for the fourth transistor MP4 of the embodiments in accordance with the present invention.

This means that the W/L ratio need only be multiplied by $(0.55)^2 \approx 0.3$.

That is, in accordance with the present invention, the gate size of the second and third transistors MP2 and MP3 functioning as switching transistors and the fourth transistors MP4 can be reduced to about one third of that of the conventional example, resulting in an advantage of minimization in the chip area.

Additionally, when the third constant current source is provided in the current switching circuit of the present invention, the potential settling time is decreased in the switching operation and hence the switching speed is further increased.

Furthermore, in accordance with the voltage level converter circuit of the present invention, when the interconnection point between the third and fourth transistors MP3 and MP4 is employed to output the voltage output signal, a digital signal having a phase opposite to that of the input signal is advantageously attained from the connection point the signal having a small amplitude suitable for transmission of high-frequency digital signals.

Moreover, in accordance with a D/A converter including the current switching circuits of the present invention the signal conversion speed is increased and the reference voltage input terminal is unnecessary.

This resultantly leads to an advantage that the circuit configuration is simplified and hence the chip area is minimized.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A current switching circuit having a signal input terminal and a current output terminal, the current switching circuit comprising:

a first node;

a constant current source connected to said first node;

a first switching transistor connected between the first node and a second node, the first switching transistor having a first control electrode, said first control electrode being connected to the signal input terminal;

a second switching transistor connected between the first node and the current output terminal, the second switching transistor having a second control electrode, said second control electrode being connected to the second node; and a resistive conduction member interconnected between the second node and a predetermined potential for a resistive current conduction therebetween.

2. A current switching circuit according to claim 1, further comprising another constant current source connected to the second node.

3. A decoder current switching circuit comprising;

a plurality of current switching circuits, each of said plurality comprising:

a first node;

a constant current source connected to the first node:

a first switching transistor connected between the first node and a second node, the first switching transistor having a first control electrode, said first control electrode being connected to the signal input terminal;

a second switching transistor connected between the first node and the current output terminal, the second switching transistor having a second control electrode, said second control electrode being connected to the second node; and a resistive conduction member interconnected between the second node and a predetermined potential for a resistive current conduction therebetween; and a decoder having a plurality of bit-representative signal output terminals each respectively connected to the signal input terminal of a corresponding one of said plurality of current switching circuits; and a common output terminal connected to each of said current output terminals of said plurality of current switching circuits.

4. A current switching circuit according to claim 1, wherein the current output terminal is connected to the predetermined potential, and wherein the second node is connected to a voltage output terminal.

5. A current switching circuit according to claim 1, wherein the first and second switching transistors each comprise a p-channel MOS transistor, and wherein the predetermined potential represents a ground potential.

6. A current switching circuit according to claim 1, wherein the first and second switching transistors each comprise an n-channel MOS transistor, and wherein the predetermined potential represents a power supply voltage.

* * * * *